United States Patent
Li et al.

(10) Patent No.: US 12,411,611 B2
(45) Date of Patent: Sep. 9, 2025

(54) METHOD AND DEVICE FOR TESTING MEMORY WITH INSTRUCTION SIGNAL

(71) Applicant: CHANGXIN MEMORY TECHNOLOGIES, INC., Hefei (CN)

(72) Inventors: Yu Li, Hefei (CN); Beiyou Zhao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 436 days.

(21) Appl. No.: 17/954,556

(22) Filed: Sep. 28, 2022

(65) Prior Publication Data

US 2023/0014477 A1 Jan. 19, 2023

Related U.S. Application Data

(63) Continuation of application No. PCT/CN2022/098451, filed on Jun. 13, 2022.

(30) Foreign Application Priority Data

May 12, 2022 (CN) ......................... 202210519509.1

(51) Int. Cl.
*G06F 3/06* (2006.01)
(52) U.S. Cl.
CPC .......... *G06F 3/0616* (2013.01); *G06F 3/0659* (2013.01); *G06F 3/0673* (2013.01)
(58) Field of Classification Search
CPC .................................................. G06F 3/0616
USPC ....................................................... 711/154
See application file for complete search history.

(56) References Cited

U.S. PATENT DOCUMENTS

| | | | | | |
|---|---|---|---|---|---|
| 5,644,541 | A | * | 7/1997 | Siu | G11C 29/80 365/201 |
| 5,923,599 | A | * | 7/1999 | Hii | G11C 29/20 365/201 |
| 5,966,389 | A | * | 10/1999 | Kiehl | G06F 11/1008 714/763 |
| 6,505,282 | B1 | * | 1/2003 | Langendorf | G06F 13/1694 711/E12.089 |

(Continued)

FOREIGN PATENT DOCUMENTS

CN 109063323 A 12/2018

OTHER PUBLICATIONS

"JEDEC Standard Low Power Double Data Rate 5 (LPDDR5)" JESD209-5A (Revision of JESD209-5, Dec. 1, 2018) Jan. 2020, 546 pages.

*Primary Examiner* — Titus Wong
(74) *Attorney, Agent, or Firm* — Syncoda LLC; Feng Ma

(57) ABSTRACT

A method and a device for memory testing, and a computer-readable storage medium are provided. In the method, an instruction signal is sent to the memory, the instruction signal comprising a randomly generated write instruction or read instruction; a valid Column Address Strobe (CAS) instruction for ensuring running of the instruction signal is randomly inserted before the instruction signal by detecting a specific type of the instruction signal, and at least one of a redundant CAS instruction or invalid command irrelevant to the instruction signal is randomly generated and inserted; and the memory is enabled to run the instruction signal, the inserted valid CAS instruction, and the at least one of the redundant CAS instruction or the invalid command, and the running of the memory is tested.

17 Claims, 7 Drawing Sheets

(56) References Cited

U.S. PATENT DOCUMENTS

| | | | |
|---|---|---|---|
| 7,219,285 B2 * | 5/2007 | Tanaka | G06F 11/1068 |
| | | | 365/201 |
| 2002/0080657 A1 * | 6/2002 | Mine | G11C 11/406 |
| | | | 365/200 |
| 2007/0195623 A1 * | 8/2007 | Callaway | G11C 29/38 |
| | | | 365/201 |
| 2017/0092349 A1 * | 3/2017 | Lee | G11C 11/406 |
| 2018/0233211 A1 * | 8/2018 | Yu | G11C 29/028 |
| 2020/0020369 A1 * | 1/2020 | Kim | G11C 7/1087 |

\* cited by examiner

METHOD AND DEVICE FOR TESTING MEMORY WITH INSTRUCTION SIGNAL

CROSS-REFERENCE TO RELATED APPLICATION

The application is a continuation application of International Patent Application No. PCT/CN2022/098451, filed on Jun. 13, 2022, which is based on and claims priority to Chinese Patent Application No. 202210519509.1, filed on May 12, 2022, and entitled "METHOD AND DEVICE FOR TESTING MEMORY, ELECTRONIC DEVICE AND READABLE STORAGE MEDIUM". The contents of International Patent Application No. PCT/CN2022/098451 and Chinese Patent Application No. 202210519509.1 are incorporated herein by reference in their entireties.

TECHNICAL FIELD

The disclosure relates to the field of memory testing, and particularly, to a method and a device for testing a memory, an electronic device and a readable storage medium.

BACKGROUND

In the field of memory testing, it is necessary to insert different Column Address Strobe (CAS) instructions as much as possible in order to make the test result as accurate as possible. However, both the usage scenario requirements and timing of CAS instruction must meet the protocol specifications of the memory. There is correlation between the CAS instructions, thus each CAS instruction must also meet the protocol specification without any errors that could affect the subsequent operations.

However, in order to satisfy the protocol specification, the memory testing methods currently used in the field cannot implement the requirement of inserting different CAS instructions as much as possible, which makes the existing memory testing methods unable to simulate all the situations that may be encountered in the actual use of the memory, and the operation is complicated.

It is to be noted that the information disclosed in the background above is only for enhancement of understanding of the background of the present disclosure and therefore may include information that does not constitute related art known to the person of ordinary skilled in the art.

SUMMARY

The disclosure provide a method and a device for testing the memory.

According to a first aspect of the present disclosure, there is provided a method for testing a memory, including: sending an instruction signal to the memory, the instruction signal comprising a randomly generated write instruction or read instruction; randomly inserting a valid Column Address Strobe (CAS) instruction before the instruction signal by detecting a specific type of the instruction signal, the CAS instruction being used for ensuring running of the instruction signal, and randomly generating and inserting at least one of a redundant CAS instruction or invalid command irrelevant to the instruction signal; and enabling the memory to run the instruction signal, the inserted valid CAS instruction, and the at least one of the redundant CAS instruction or the invalid command, and testing the running of the memory.

According to another aspect of the present disclosure, there is provided a device for testing a memory, including: an instruction signal generator, connected with the memory and configured to send an instruction signal to the memory; a first detector, connected with the instruction signal generator and configured to detect a specific type of the instruction signal; a random signal generator, connected with the first detector and configured to: randomly insert a valid Column Address Strobe (CAS) instruction before the instruction signal, and randomly generate and insert at least one of a redundant CAS instruction or invalid command irrelevant to the instruction signal, the CAS instruction being used for ensuring running of the instruction signal; and a tester, connected with the memory and configured to test an operation of the memory; wherein the instruction signal comprises a randomly generated write instruction or read instruction.

According to yet another aspect, there is provided a computer-readable storage medium having stored thereon a computer program that when executed by a processor, implements a method for testing the memory, the method including: sending an instruction signal to the memory, the instruction signal comprising a randomly generated write instruction or read instruction; randomly inserting a valid Column Address Strobe (CAS) instruction before the instruction signal by detecting a specific type of the instruction signal, the CAS instruction being used for ensuring running of the instruction signal, and randomly generating and inserting at least one of a redundant CAS instruction or invalid command irrelevant to the instruction signal; and enabling the memory to run the instruction signal, the inserted valid CAS instruction, and the at least one of the redundant CAS instruction or the invalid command, and testing the running of the memory.

It is to be understood that the above general description and detailed description below are only exemplary and explanatory and are not intended non limit the present disclosure.

BRIEF DESCRIPTION OF THE DRAWINGS

The drawings herein are incorporated into and constitute a part of the specification, which illustrate embodiments in accordance with the disclosure and together with the specification serve to explain the principles of the disclosure. Apparently, the drawings of the following description are merely some embodiments of the disclosure. For a person of ordinary skill in the art, other drawings can be obtained based on these drawings without creative work.

REFERENCE NUMERALS

Figure 1:
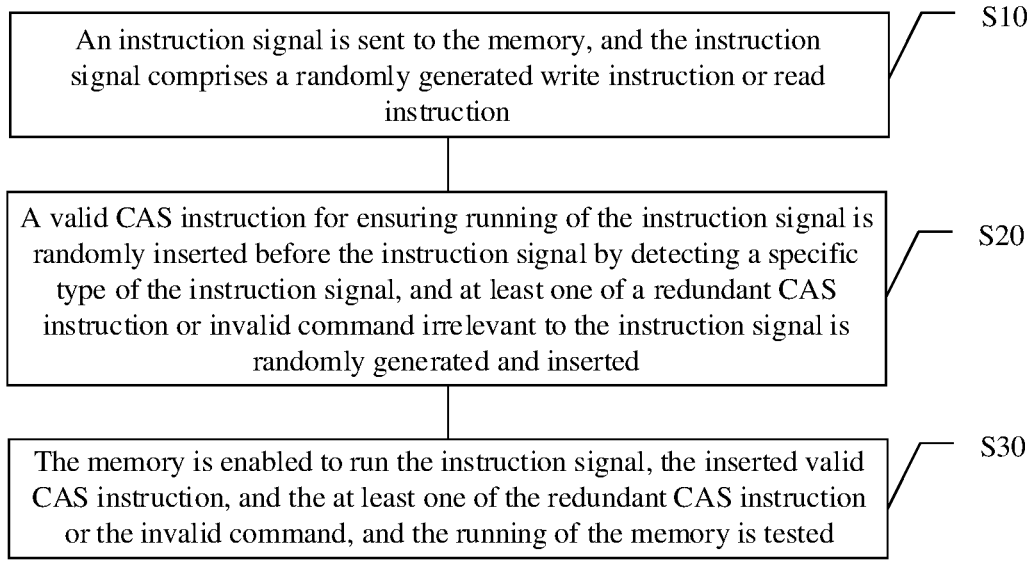
FIG. 1 is a schematic flow chart of a method for testing a memory according to an exemplary embodiment of the disclosure.

1. Memory
2. Device for testing a memory; 21. Instruction signal generator; 22. First Detector; 23. Random signal generator; 24. Tester; 25. Counter; 231. Second Detector; 232. Processor; 233. Signal generator; 2321. Calculation element; 2322. Acquisition element; 2323. Determination element;
3. Electronic device; 31. Processor; 32. Memory; 33. Bus; 34. Display unit; 35. Input/Output (I/O) interface; 36. Network adapter; 37. External equipment; 321. Random access memory unit; 322. Cache unit; 323. Read-only memory unit; 324. Programs/utilities; 325. Program module; 4. Computer program.

DETAILED DESCRIPTION

Exemplary implementations will be described in more detail below with reference to the accompanying drawings. However, exemplary embodiments can be implemented in a variety of forms and should not be construed as being limited to the embodiments described herein. Instead, these embodiments are provided so that the present disclosure will be comprehensive and complete and the concept of the exemplary embodiments will be fully communicated to those skilled in the art. A same reference numeral in the drawings indicates a same or similar structure, and thus the detailed description will be omitted.

The terms "a", "an", "the", "said" and "at least one" are used to indicate the existence of one or more elements/components/etc. The terms "include" and "have" are used to indicate open-ended inclusion and indicate that there may exist additional elements/components/etc. in addition to the listed elements/components/etc.

In addition, the described features, structures or characteristics may be incorporated in any suitable manner in one or more embodiments. In the following description, many specific details are provided to give a full understanding of the embodiments of the present disclosure. However, it is to be understood for those skilled in the art that the technical solution of the present disclosure may be implemented without one or more of the specific details described or other methods, components, devices, steps and the like may be used. In other cases, the well-known structures, methods, devices, implementations, materials or operations are not illustrated or described in detail to avoid obscuring the aspects of the present disclosure.

The block diagrams illustrated in the accompanying drawings are merely functional entities and do not necessarily correspond to physically independent entities. That is, the functional entities may be implemented in the form of software, or the functional entities or part of the functional entities may be implemented in one or more software-hardened modules, or the functional entities may be implemented in different networks and/or processor devices and/or microcontroller devices.

With the continuous improvement of the use scenarios and requirements of electronic devices (such as mobile phone, computer, tablet computer, television and smart watch, etc.), the requirements for the stability of electronic devices in use are constantly improving. As an indispensable part of the electronic device, the performance and stability of memory also need to be continuously improved.

In the related art, the memory currently used may include: Static Random Access Memory (SRAM) and Dynamic Random Access Memory (DRAM). The DRAM may include Rambus Dynamic Random Access Memory (RDRAM), Double Data Rate Synchronous Dynamic Random Access Memory (DDR SDRAM), or the like.

In order to ensure that the memory has good performance and stability during subsequent use, it is necessary to thoroughly test and verify the performance and stability of the memory before the use. It requires that the situations that may occur during subsequent use of the memory can be simulated as much as possible to perform a thoroughly test and verification during the test.

However, the applicant of the present disclosure, after carefully studying the existing memory test method, found that the existing memory test method cannot meet the requirement of randomly inserting different CAS instructions as much as possible. As such, the existing memory test method cannot simulate all the possible cases that the memory may encounter as much as possible during the test, so that the scenario coverage of the test with the existing memory test method is low, and the operation is complex.

In order to solve the above technical problems, after careful consideration and a great deal of creative work, the inventor of the present disclosure has invented a new memory testing method, which can expand the scenario coverage of the test, so that all the situations that may be encountered in the actual use of the memory can be simulated as thoroughly as possible during the test.

In an embodiment of the disclosure, as illustrated in FIG. 1, the memory testing method includes steps S10 to S30.

At step S10, an instruction signal is sent to the memory, and the instruction signal includes a randomly generated write instruction or read instruction.

At step S20, a valid CAS instruction for ensuring running of the instruction signal is randomly inserted before the instruction signal by detecting a specific type of the instruction signal, and at least one of a redundant CAS instruction or invalid command irrelevant to the instruction signal is randomly generated and inserted.

At step S30, the memory is enabled to run the instruction signal, the inserted valid CAS instruction, and the at least one of the redundant CAS instruction or the invalid command, and the operation of the memory is tested.

Taking Low Power Double Data Rate 5 (LPDDR5) memory as an example, the method for testing the memory is described in detail.

At step S10, an instruction signal may be sent to the memory by using an instruction signal generator. The instruction signal includes a write instruction or a read instruction. The write instruction may include a memory write instruction (wr) and a register write instruction (mwr). The read instruction signal may include a memory read instruction (rd) and a register read instruction (mrr).

The instruction signal sent to the memory may be a single instruction signal or an instruction string including a plurality of instruction signals. For example, a single write instruction or read instruction may be sent to the memory, and the write instruction or read instruction may be sampled at a first sampling time. Alternatively, an instruction string may be sent to the memory, the instruction string may include a plurality of write instructions and/or read instructions and other instructions, and the instruction string conforms to a first-in first-out queue. For example, the instruction string can be wr, rd, wr, rd, mrr. At this case, the first instruction in the instruction string is wr, the memory runs wr first, and then starts running rd after the operation of running wr is finished, and so on. After the operation of running rd is finished, the memory starts running the second wr, runs the second rd after the operation of running the second wr is finished, and finally runs mrr to end the whole process.

In the present embodiment, the instruction signal may be randomly generated. That is, in the disclosure, there is no need to set the type of instruction signal to be inserted in advance. The instruction signal transmitter can randomly select the instruction signal to be inserted among various types of instruction signals, such that the randomness of the method for testing the memory can be increased and the scenario coverage of the test can be expanded to detect the operation of the memory under various scenarios.

At the above step S20, the specific type of the instruction signal can be first detected to determine whether the random instruction signal sent to the memory is a write instruction, a read instruction or other instruction signals. When the instruction signal sent by the instruction signal transmitter to the memory is an instruction string including a plurality of instruction signals, the specific types of all instructions of the instruction string can be detected simultaneously, or the specific types of the instructions of the instruction string can be detected at different times.

In the present embodiment, after a specific type of the instruction signal is detected, a valid CAS instruction for ensuring running of the instruction signal may be randomly inserted before the instruction signal. Since the first-in first-out queue is satisfied when the memory is running the instructions, in the first-in first-out queue, the latter instruction signal can start running only after the operation of running the previous instruction signal is finished, and the previous instruction signal will retire after finishing running. Therefore, at this case, the operation of inserting a valid CAS instruction for ensuring the running of the instruction signal before the instruction signal is to ensure the operation of the next instruction signal adjacent to the CAS instruction. For example, when the instruction string is wr, rd, wr, rd and nrr, a valid CAS instruction can be randomly inserted before the first wr instruction to ensure the running of wr, and after the corresponding valid CAS instruction is obtained, the running of the next wr instruction adjacent to the valid CAS instruction (i.e., the first wr instruction) can be guaranteed. The first wr instruction will retire after finishing running, thus the valid CAS instruction randomly inserted before the rd instruction is to ensure the running of the rd instruction after the valid CAS instruction.

In the disclosure, the instruction signals are sent by using the first-in first-out queue manner, so that the sequence of running the instruction signals can be known in advance during the test, thereby achieving the purpose of randomly inserting the valid CAS instructions. Moreover, in the disclosure, since the instruction signal is randomly generated, the valid CAS instruction is also randomly generated and inserted, such that the accuracy and randomness of the test can be enhanced.

In an embodiment of the present disclosure, the valid CAS instructions may include: CAS_WR instruction, CAS_FS instruction, and CAS_RD instruction. But not limited thereto, the valid CAS instruction may also include a CAS_OFF instruction or the like, all of which are within the scope of protection of the present disclosure. CAS_WR can be used to synchronize the write clock, so that the next wr or mwr instruction adjacent to CAS_WR can be run. CAS_RD instruction can be used to synchronize the read clock, so that the next rd or mrr instruction adjacent to CAS_RD can be run. CAD_FS instruction can be used to synchronize the previous write clock or read clock.

Therefore, when it is detected that the specific type of the detected current instruction signal is the write instruction, the CAS_WR instruction or the CAS_FS instruction can be randomly inserted before the write instruction, so as to ensure the normal operation of the current write instruction. When it is detected that the specific type of the current instruction signal is read instruction, CAS_RD instruction or CAS_FS instruction can be randomly inserted before the read instruction, so as to ensure the normal operation of the current read instruction. It is to be noted that when the CAS_FS instruction is inserted before the write instruction and the read instruction, it is necessary to ensure that the previous valid CAS instruction is still in its maintenance duration.

In the present embodiment, each valid CAS instruction has a maintenance duration. If the maintenance duration of the previous CAS_WR instruction has not expired, there is no need synchronize the write clock before the current wr instruction, and there is no need to insert a new CAS_WR instruction before the current wr instruction. If the maintenance duration of the last CAS_WR instruction expires, the CAS_WR instruction must be used to synchronize the write clock before running the current write instruction to ensure that the current wr instruction can be run.

Similarly, if the maintenance duration of the previous CAS_RD instruction has not expired, there is no need to synchronize the read clock before the current rd instruction, and there is no need to insert a new CAS_RD instruction before the current rd instruction. If the maintenance duration of the last CAS_RD instruction expires, the CAS_RD instruction must be used to synchronize the read clock before running the current rd instruction to ensure that the current rd instruction can be run.

If the previous instruction signal is rd instruction and the current instruction signal is wr instruction, a CAS_WR instruction must be inserted before the current wr instruction. On the contrary, if the previous instruction signal is wr instruction and the current instruction signal is rd instruction, a CAS_RD instruction must be inserted before the current rd instruction.

It is to be noted that, in the disclosure, since the instruction signals satisfy the requirement of the first-in first-out queue, the previous instruction signal can be understood as the instruction signal that has finished running and retired, and the current instruction signal can be understood as the instruction signal that is about to start running after the running of the previous instruction signal adjacent to the current instruction signal is completed.

If the current instruction signal is a wr instruction and the CAS_FS instruction is run before the current instruction signal to synchronize the write clock, there is no need to insert CAS_WR instruction before the current wr instruction. Moreover, at this case, if the subsequent instruction signals are all wr instructions, there is no need to insert CAS_WR instruction before each subsequent wr instruction signal in the maintenance duration of the CAS_FS instruction.

If the current instruction signal is the rd instruction and the CAS_FS instruction is run before the current instruction signal to synchronize the read clock, at this case, there is no need to insert the CAS_RD instruction before the current rd instruction. Moreover, at this case, if the subsequent instruction signals are all rd instructions, there is no need to insert CAS_RD instruction before the each subsequent wr instruction signal in the maintenance duration of the CAS_FS instruction.

The above CAD_OFF instruction can be used to end the current clock synchronization state. It is to be understood that: if the maintenance duration of the previous CAS_WR instruction or the CAS_FS instruction synchronizing the write clock has not expired, a CAD_OFF instruction can be inserted to end the write clock synchronization state. At this case, a CAS_WR instruction must be reinserted before the current wr instruction to synchronize the write clock again, so as to ensure the running of the current wr instruction. Similarly, if the maintenance duration of the previous CAS_RD instruction or the CAS_FS instruction synchronizing the write clock has not expired, a CAD_OFF instruction can be inserted to end the read clock synchronization state. At this case, a CAS_RD instruction must be reinserted before the current rd instruction to synchronize the read lock again, so as to ensure the running of the current rd instruction.

In addition, if a power failure occurs before running the current instruction signal, the synchronization state of the clock will be terminated immediately when the power failure occurs. At this case, if the current instruction signal is needed to be run after power-on, a valid CAS instruction for ensuring the running of the current instruction signal must be inserted before the current instruction signal. For example, if the current instruction signal is a wr instruction, at this case, if power failure occurs, the CAS_WR instruction must be inserted before the wr instruction after power-on to synchronize the write clock. Similarly, if the current instruction signal is a rd instruction, at this case, if the power failure occurs, a CAS_RD instruction must be inserted before the rd instruction after power-on to synchronize the read clock.

In the present embodiment, the redundant CAS instruction irrelevant to the instruction signal can also be randomly generated and inserted, and the redundant CAS instruction can be inserted before the instruction signal or after the instruction signal. By randomly generating and inserting the redundant CAS instruction, the randomness of instruction insertion can further be enhanced, thereby enabling the method for testing the memory to simulate as much as possible the situations that the memory may encounter in the actual operation during the testing, so as to ensure that the memory passing the test can have higher stability during the actual use.

In an embodiment of the present disclosure, the number of redundant CAS instructions randomly generated and inserted may be more than one. That is, it is to be understood that: a plurality of redundant CAS instructions may be inserted before the instruction signal, or a plurality of redundant CAS instructions may be inserted after the instruction signal, or at least one redundant CAS instruction is inserted before the designated signal and at least one redundant CAS instruction is inserted after the designated signal.

The redundant CAS instruction mentioned above has various types. For example, the redundant CAS instruction signal may include at least one of: a CAS_WRX instruction, a CAS_WRSB instruction or a CAS_DC instruction. The CAS_WRX instruction can be used to write random data. The CAS_WRSB instruction can be used to repeatedly write high-byte data, and when the CAS_WRSB instruction is 1, all the high-bytes [15:8] are 1, and when the CAS_WRSB instruction is 0, all the high-bytes [15:8] are 0. The CAS_DC instruction can be used to copy data of a first burst and storing the data of the first burst. But not limited thereto, the redundant CAS instruction may also include other CAS instructions.

Figure 2:
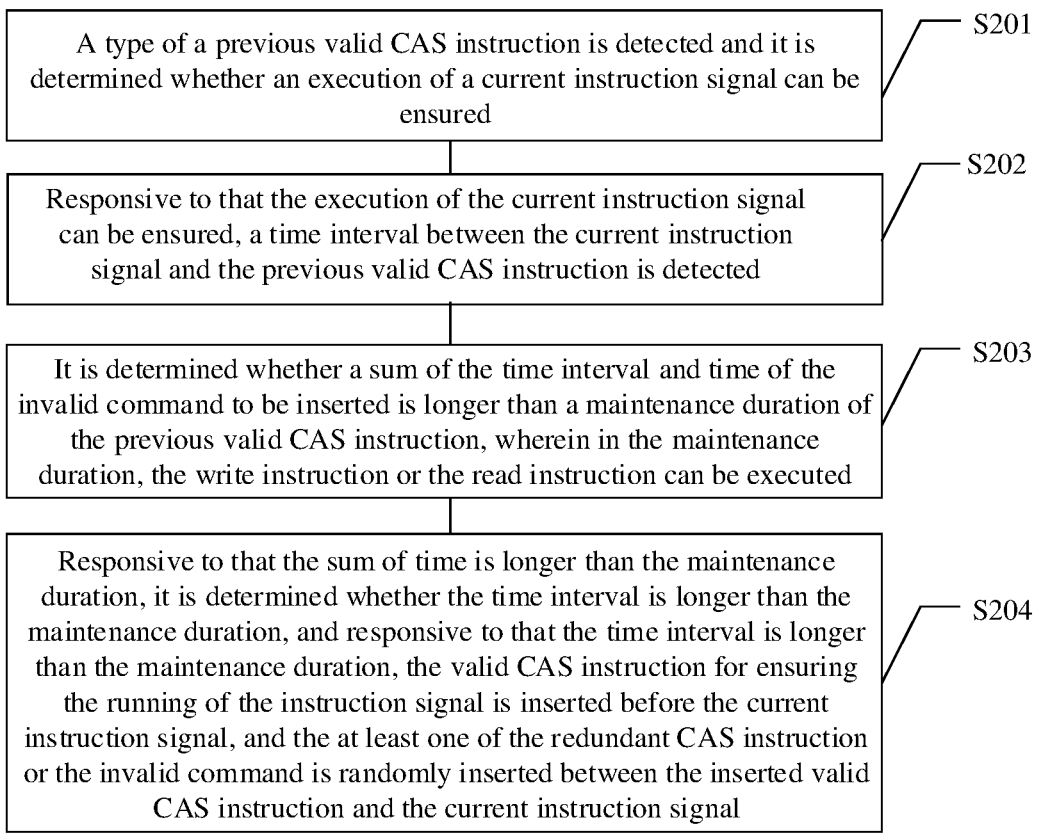
FIG. 2 is a schematic flow chart of part of step S20 in FIG. 1 according to an exemplary embodiment of the disclosure.

In an embodiment of the disclosure, as illustrated in FIG. 2, the operation that a valid CAS instruction for ensuring running of the instruction signal is randomly inserted before the instruction signal, and at least one of a redundant CAS instruction or invalid command irrelevant to the instruction signal is randomly generated and inserted includes steps S201 to S204.

At step S201, a type of a previous valid CAS instruction is detected and it is determined whether an execution of a current instruction signal can be ensured.

At step S201, responsive to that the execution of the current instruction signal can be ensured, a time interval between the current instruction signal and the previous valid CAS instruction is detected.

At step S203, it is determined whether a sum of the time interval and time of the invalid command to be inserted is longer than a maintenance duration of the previous valid CAS instruction, herein in the maintenance duration, the write instruction or the read instruction can be executed.

At step S204, responsive to that the sum of time is longer than the maintenance duration, it is determined whether the time interval is longer than the maintenance duration, and responsive to that the time interval is longer than the maintenance duration, the valid CAS instruction for ensuring the running of the instruction signal is inserted before the current instruction signal, and the at least one of the redundant CAS instruction or the invalid command is randomly inserted between the inserted valid CAS instruction and the current instruction signal.

The above steps S201 to S204 are described in detail with examples as below.

When the current instruction signal is wr, the type of the previous valid CAS instruction can be detected. When the type of the previous valid CAS instruction is CAS_WR instruction, it can be determined that the previous valid CAS instruction can guarantee the execution of the current instruction signal wr. At this case, the time interval between the wr instruction and the detected CAS_WR instruction can be detected.

The sum of time of the time interval between the wr instruction and the detected CAS_WR instruction and the invalid command to be inserted before the wr instruction, or the sum of time of the time interval and the invalid command and/or redundant CAS instruction to be inserted before the wr instruction can be calculated. The maintenance duration of the CAS_WR instruction can be obtained, and it is determined whether the sum of time is longer than the maintenance duration of the CAS_WR instruction.

If the sum of time is longer than the maintenance duration of the detected CAS_WR instruction, it indicates that when the wr instruction is to be run, the maintenance duration of the CAS_WR instruction may end, at this case, the write clock may be out of synchronization status.

At this case, in order to further determine the synchronization status of the write clock when wr instruction is to be run, it may be determined whether the above time interval is longer than the maintenance duration of the CAS_WR instruction. If the time interval is longer than the CAS_WR instruction, it means that the write clock must be out of synchronization status when the wr instruction is to be run.

Thus, in order to ensure the normal operation of the current wr instruction, a new CAS_WR instruction needs to be randomly inserted before the wr instruction for resynchronizing the write clock. Further, the redundant CAS instruction and/or invalid command may be randomly inserted between the inserted valid CAS instruction and the wr instruction.

Similarly, when the current instruction signal is rd, the type of the previous valid CAS instruction can be detected. When the type of the previous valid CAS instruction is CAS_RD instruction, it can be determined that the previous valid CAS instruction can guarantee the execution of the current instruction signal rd. At this case, the time interval between the rd instruction and the detected CAS_RD instruction can be detected.

The sum of time of the time interval between the rd instruction and the detected CAS_RD instruction and the invalid command to be inserted before the rd instruction, or the sum of time of the time interval and the invalid command and/or redundant CAS instruction to be inserted before the rd instruction can be calculated. The maintenance duration of the CAS_RD instruction can be obtained, and it is determined whether the sum of time is longer than the maintenance duration of the CAS_RD instruction.

If the above sum of time is longer than the maintenance duration of the detected CAS_RD instruction, it indicates that when the rd instruction is to be run, the maintenance duration of the CAS_RD instruction may expire, at this case, the read clock may be out of synchronization status.

At this case, in order to further determine the synchronization status of the write clock when rd instruction is to be run, it may be determined whether the time interval is longer than the maintenance duration of the CAS_RD instruction. If the time interval is longer than the maintenance duration of CAS_RD instruction, it means that the read clock must be out of synchronization status when the rd instruction is to be run. Thus, in order to ensure the normal operation of the current rd instruction, a new CAS_RD instruction needs to be randomly inserted before the rd instruction for resynchronizing the read clock. Further, the redundant CAS instruction and/or invalid command may be randomly inserted between the inserted valid CAS instruction and the rd instruction.

Therefore, according to the test method provided by the embodiment, the cases of inserting redundant CAS instruction can be expanded, such that the operation stability of the memory when inserting redundant CAS instruction may be tested.

In addition, in the present embodiment, if the type of the previous valid CAS instruction is detected to be unable to guarantee the execution of the current instruction signal, it is necessary to insert the valid CAS instruction for ensuring the running of the instruction signal before the instruction signal so as to enable the instruction signal to operate normally.

In an embodiment of the present disclosure, when the time interval between the current instruction signal and the previous valid CAS instruction is equal to the maintenance duration of the previous valid CAS instruction, the current instruction signal can be executed in the remaining maintenance duration of the previous valid CAS instruction; alternatively, a valid CAS instruction for ensuring the running of the current instruction signal can be inserted before the current instruction signal, a redundant CAS instruction and/or an invalid command is inserted before the current instruction signal in the maintenance duration of the inserted valid CAS instruction, and then the current command signal is executed. Therefore, in the present disclosure, the test scenarios of the memory can further be expanded through the above two manners of executing the instruction signal.

For example, if the current instruction signal is wr and the previous valid CAS instruction is CAS_WR instruction, when the time interval between wr instruction and CAS_WR instruction is equal to the maintenance duration of CAS_WR instruction, it can be considered that the write clock is still synchronous. Thus, at this case, the current wr instruction can be directly executed in the remaining maintenance duration of CAS_WR instruction. Alternatively, a CAS_FS instruction is inserted before the current wr instruction, and one or more types of redundant CAS instructions and/or invalid commands from the CAS_WRX instruction, the CAS_WRSB instruction and the CAS_DC instruction is inserted in the maintenance duration of the CAS_FS instruction, and then the current wr instruction is executed.

It is to be noted that, in the above embodiments, the redundant CAS instruction and/or invalid command is inserted only once, that is, the redundant CAS instruction and/or invalid command is inserted after the valid CAS instruction is inserted.

However, in the present embodiment, the redundant CAS instruction and/or invalid command may be inserted for a plurality of times. That is, the redundant CAS instruction and/or invalid command is inserted once before the valid CAS instruction is inserted, and the redundant CAS instruction and/or invalid command is inserted again after the valid CAS instruction is inserted. For example, when the time interval between the wr instruction and the CAS_WR instruction is equal to the maintenance duration of the CAS_WR instruction, one or more types of redundant CAS instructions and/or invalid commands, which is from the CAS_WRX instruction, the CAS_WRSB instruction and the CAS_DC instruction, may be inserted first, then the CAS_FS instruction is inserted, and then one or more types of redundant CAS instructions and/or invalid commands, which is from the CAS_WRX instruction, the CAS_WRSB instruction and the CAS_DC instruction, is inserted again after the CAS_FS, and finally the wr instruction is executed. It is to be noted that, when calculating the time interval, since the time of the instruction signal is determined in advance, the interval between the current instruction signal and the previous valid CAS instruction can be known even if it does not run to the moment when the current instruction signal needs to be executed. Therefore, the redundant CAS instruction and/or invalid command can be inserted first, and it is only necessary to ensure that the inserted CAS_FS instruction can effectively synchronize the write clock or read clock.

Similarly, if the current instruction signal is rd and the previous valid CAS instruction is CAS_RD instruction, when the time interval between rd instruction and CAS_RD instruction is equal to the maintenance duration of CAS_RD instruction, it can be considered that the read clock is still synchronous. Thus, at this case, the current rd instruction can be directly executed in the remaining maintenance duration of CAS_RD instruction. Alternatively, a CAS_FS instruction is inserted before the current rd instruction, and one or more redundant CAS instructions and/or invalid commands, which are from the CAS_WRX instruction, CAS_WRSB instruction or CAS_DC instruction, are inserted in the maintenance duration of the CAS_FS instruction, and then the current rd instruction is executed.

In the present embodiment, when the time interval between the rd instruction and the CAS_RD instruction is equal to the maintenance duration of the CAS_RD instruction, one or more types of redundant CAS instructions and/or invalid commands, which is from the CAS_WRX instruction, the CAS_WRSB instruction and the CAS_DC instruction, may be inserted first, then the CAS_FS instruction is inserted, and then one or more types of redundant CAS instructions and/or invalid commands, which is from the CAS_WRX instruction, the CAS_WRSB instruction and the CAS_DC instruction, is inserted again after the CAS_FS, and finally the rd instruction is executed.

In an embodiment of the present disclosure, when the time interval between the current instruction signal and the previous valid CAS instruction is shorter than the maintenance duration of the previous valid CAS instruction, the current instruction signal can be executed directly in the remaining maintenance duration; alternatively, in the remaining maintenance duration, a redundant CAS instruction and/or an invalid command is inserted first, and then the current instruction signal is executed; alternatively, a valid CAS instruction for ensuring the running of the current instruction signal can be inserted, and a redundant CAS instruction and/or an invalid command is inserted in the maintenance duration of the inserted valid CAS instruction, and then the current instruction signal is executed. Therefore, in the present disclosure, the test scenarios of the memory can further be expanded through the above three different manners of executing the instruction signal.

For example, if the current instruction signal is wr and the previous valid CAS instruction is CAS_WR instruction, when the time interval between wr instruction and CAS_WR instruction is shorter than the maintenance duration of CAS_WR instruction, it can be considered that the write clock is still synchronous. Thus, at this case, the current wr instruction can be directly executed in the remaining maintenance duration of CAS_WR instruction. Alternatively, one or more types of redundant CAS instructions and/or invalid commands, which is from the CAS_WRX instruction, the CAS_WRSB instruction and the CAS_DC instruction, can be inserted in the remaining maintenance duration of the CAS_WR instruction, and then the wr instruction is executed. Alternatively, the CAS_FS instruction is inserted before the current wr instruction, and one or more types of redundant CAS instructions and/or invalid commands, which is from the CAS_WRX instruction, the CAS_WRSB instruction and the CAS_DC instruction, is inserted, and then the current wr instruction is executed.

Similarly, if the current instruction signal is rd and the previous valid CAS instruction is CAS_RD instruction, when the time interval between rd instruction and CAS_RD instruction is shorter than the maintenance duration of CAS_RD instruction, it can be considered that the read clock is still synchronous. Thus, at this case, the current rd instruction can be directly executed in the remaining maintenance duration of CAS_RD instruction. Alternatively, one or more types of redundant CAS instructions and/or invalid commands from the CAS_WRX instruction, CAS_WRSB instruction and CAS_DC instruction is inserted in the maintenance duration of the CAS_FS instruction, and then the current rd instruction is executed. Alternatively, the CAS_FS instruction is inserted before the current rd instruction first, and one or more types of redundant CAS instructions and/or invalid commands from the CAS_WRX instruction, the CAS_WRSB instruction and CAS_DC instruction is inserted, and then the current wr instruction is executed.

Similarly, in the present embodiment, the redundant CAS instruction and/or invalid command may be inserted multiple times. For example, when the time interval between the wr instruction and the CAS_WR instruction is shorter than the maintenance duration of the CAS_WR instruction, one or more types of redundant CAS instructions and/or invalid commands from the CAS_WRX instruction, the CAS_WRSB instruction and the CAS_DC instruction may be inserted first, then the CAS_FS instruction is inserted, and then one or more types of redundant CAS instructions and/or invalid commands from the CAS_WRX instruction, the CAS_WRSB instruction and the CAS_DC instruction is inserted again after the CAS_FS, and finally the wr instruction is executed.

In an embodiment of the disclosure, if the sum of time of the time interval and the duration of the invalid command to be inserted equals to the maintenance duration, the invalid command may be inserted, and the current instruction signal may be executed within a remaining maintenance duration; or after inserting the invalid command, the valid CAS instruction for ensuring the running of the current instruction signal may be inserted, and in the maintenance duration of the inserted valid CAS instruction, the current instruction signal is executed after inserting the redundant CAS instruction. Therefore, in the present disclosure, the running of the instruction signal when the sum of time is equal to the maintenance duration is divided into the above two different manners, such that the test scenarios of the memory can further be expanded.

For example, if the current instruction signal is wr instruction, the previous valid CAS instruction is CAS_WR instruction, and the sum of time of the time interval and the duration of the invalid command to be inserted is equal to the maintenance duration, it can be considered that the CAS_WR instruction is still maintained when the current wr instruction is to be run, and at this case, the write clock is in a synchronous status. At this case, the invalid command can be inserted before the instruction signal, and the instruction signal can be executed normally. Or, after inserting an invalid command, the CAS_FS instruction is inserted, and one or more types of redundant CAS instructions from the CAS_WRX instruction, CAS_WRSB instruction and CAS_DC instruction is inserted, and then the current wr instruction is executed.

However, in the present embodiment, the invalid command may be inserted for a plurality of times. For example, the invalid command may be inserted first, then the CAS_FS instruction is inserted, and one or more types of redundant CAS instructions from CAS_WRX instruction, CAS_WRSB instruction and CAS_DC instruction is inserted. After inserting the redundant CAS instruction, the invalid command is inserted again, and then the wr instruction is executed.

Similarly, if the current instruction signal is rd instruction, the previous valid CAS instruction is CAS_RD instruction, and the sum of time of the time interval and the duration of the invalid command to be inserted is equal to the maintenance duration, it can be considered that the CAS_RD instruction is still maintained when the current rd instruction is to be run, and at this case, the read clock is in a synchronous status. At this case, the invalid command can be inserted before the instruction signal, and the instruction signal can be executed normally. Or, after inserting an invalid command, the CAS_FS instruction is inserted, and one or more types of redundant CAS instructions from the CAS_WRX instruction, CAS_WRSB instruction and CAS_DC instruction is inserted, and then the current rd instruction is executed.

Further, the invalid command may be inserted first, then the CAS_FS instruction is inserted, and one or more types of redundant CAS instructions from CAS_WRX instruction, CAS_WRSB instruction and CAS_DC instruction is inserted. After inserting the redundant CAS instruction, the invalid command is inserted again, and then the current rd instruction is executed.

In an embodiment of the disclosure, if the sum of time of the time interval and the duration of the invalid command to be inserted is shorter than the maintenance duration, the invalid command may be inserted, and within a remaining maintenance duration, the redundant instruction can be inserted first and then the current instruction signal may be executed; or after inserting the invalid command, the valid CAS instruction for ensuring the running of the current instruction signal may be inserted, and in the maintenance duration of the inserted valid CAS instruction, the current instruction signal is executed after inserting the redundant CAS instruction. Therefore, in the present disclosure, the running of the instruction signal when the sum of time is shorter than the maintenance duration is divided into the above two different manners, thereby covering more test scenarios for the memory.

For example, if the current instruction signal is wr instruction, the previous valid CAS instruction is CAS_WR instruction, and the sum of time of the time interval and the duration of the invalid command to be inserted is shorter than the maintenance duration, it can be considered that when the current wr instruction is to be run, the CAS_WR instruction is still maintained and has extra maintenance duration, and at this case, the write clock is in a synchronous status. At this case, the invalid command can be inserted before the instruction signal. Since there is also extra maintenance duration, the CAS_FS instruction may be inserted in the remaining maintenance duration, one or more types of redundant CAS instructions from the CAS_WRX instruction, CAS_WRSB instruction and CAS_DC instruction is inserted, and the instruction signal can be executed normally. Or, after inserting an invalid command, the CAS_FS instruction is inserted, and one or more types of redundant CAS instructions from the CAS_WRX instruction, CAS_WRSB instruction and CAS_DC instruction is inserted, and then the current wr instruction is executed.

Similarly, if the current instruction signal is rd instruction, the previous valid CAS instruction is CAS_RD instruction, and the sum of time of the time interval and the duration of the invalid command to be inserted is shorter than the maintenance duration, it can be considered that when the current rd instruction is to be run, the CAS_RD instruction is still maintained and has extra maintenance duration, and at this case, the write clock is in a synchronous status. At this case, the invalid command can be inserted before the rd instruction. Since there is extra maintenance duration, in the remaining maintenance duration, the CAS_FS instruction may be inserted, and one or more types of redundant CAS instructions among the CAS_WRX instruction, CAS_WRSB instruction, and CAS_DC instruction is inserted, and the rd instruction can be executed normally. Or, after inserting an invalid command, the CAS_FS instruction is inserted, and one or more types of redundant CAS instructions from the CAS_WRX instruction, CAS_WRSB instruction, and CAS_DC instruction is inserted, and then the current rd instruction is executed.

In the present embodiment, the invalid command may be inserted for a plurality of times, which is also within the scope of protection of the disclosure.

In an embodiment of the disclosure, after the valid CAS instruction inserted in the maintenance duration of the previous valid CAS instruction, before the current instruction signal, a number of the inserted redundant instructions and/or the invalid commands is not greater than 7 in total, to avoid that the memory runs incorrectly due to the invalid command cannot be executed. In the present embodiment, the valid CAS instruction inserted in the maintenance duration of the previous valid CAS instruction may be a CAS_FS instruction.

In an embodiment of the disclosure, the above-mentioned maintenance duration may be a maximum maintenance duration of the previous valid CAS instruction, or a minimum maintenance duration of the previous valid CAS instruction, or an average maintenance duration of all valid CAS instructions.

Figure 3:
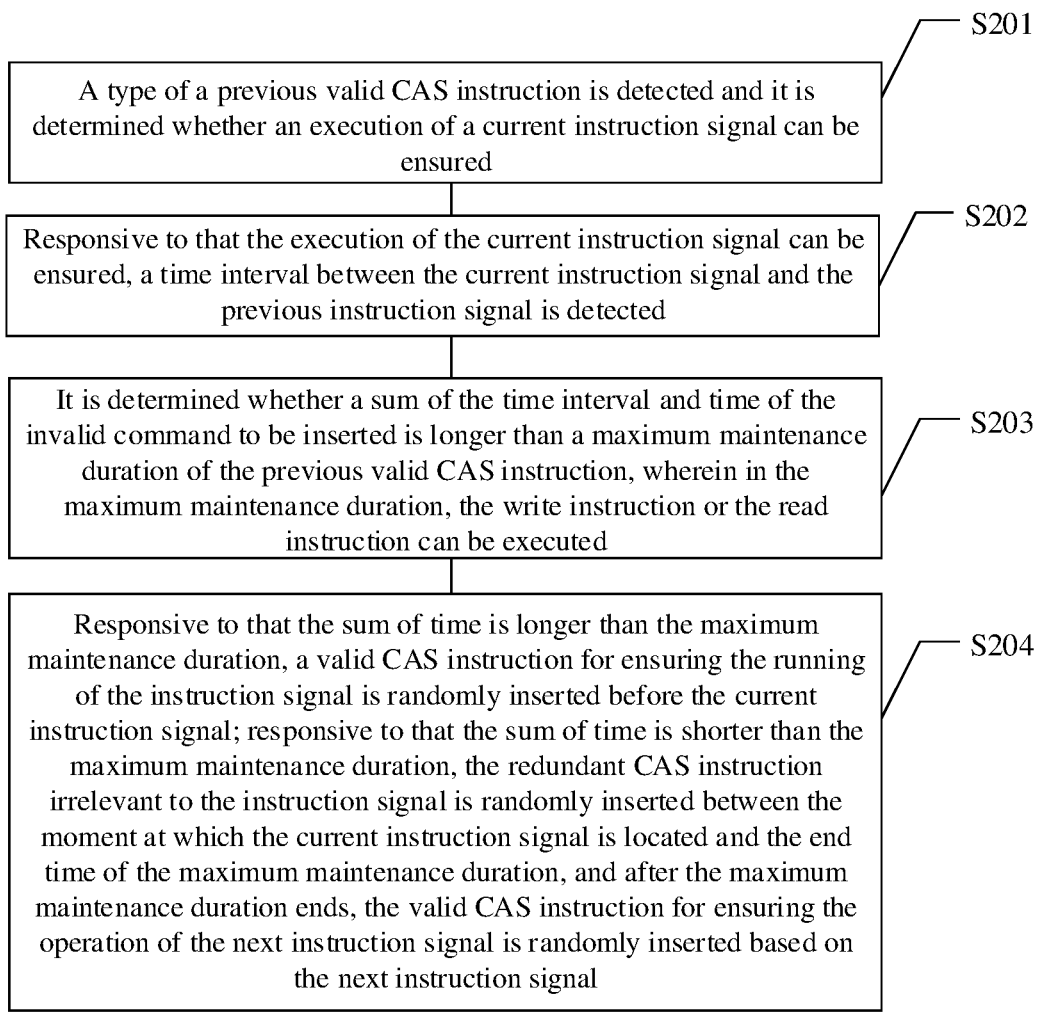
FIG. 3 is a schematic flow chart of part of step S20 in FIG. 1 according to another exemplary embodiment of the disclosure.

In another embodiment of the disclosure, if the sum of time is longer than the maintenance duration, it is not necessary to determine whether the time interval is longer than the maintenance duration. That is, as illustrated in FIG. 3, S20 may include steps S201 to S204. At step S201, a previous valid CAS instruction is detected and it is determined whether an execution of a current instruction signal can be ensured. At step S202, responsive to that the execution of the current instruction signal can be ensured, a time interval between the current instruction signal and the previous instruction signal is detected. At step S203, it is determined whether a sum of the time interval and time of the invalid command to be inserted is longer than a maximum maintenance duration of the previous valid CAS instruction, herein in the maximum maintenance duration, the write instruction or the read instruction can be executed. At step S204, if the sum of time is longer than the maximum maintenance duration, a valid CAS instruction for ensuring the running of the instruction signal is randomly inserted before the current instruction signal. If the sum of time is shorter than the maximum maintenance duration, the redundant CAS instruction irrelevant to the instruction signal is randomly inserted between the moment at which the current instruction signal is located and the end time of the maximum maintenance duration, and after the maximum maintenance duration ends, the valid CAS instruction for ensuring the operation of the next instruction signal is randomly inserted based on the next instruction signal.

Figure 4:
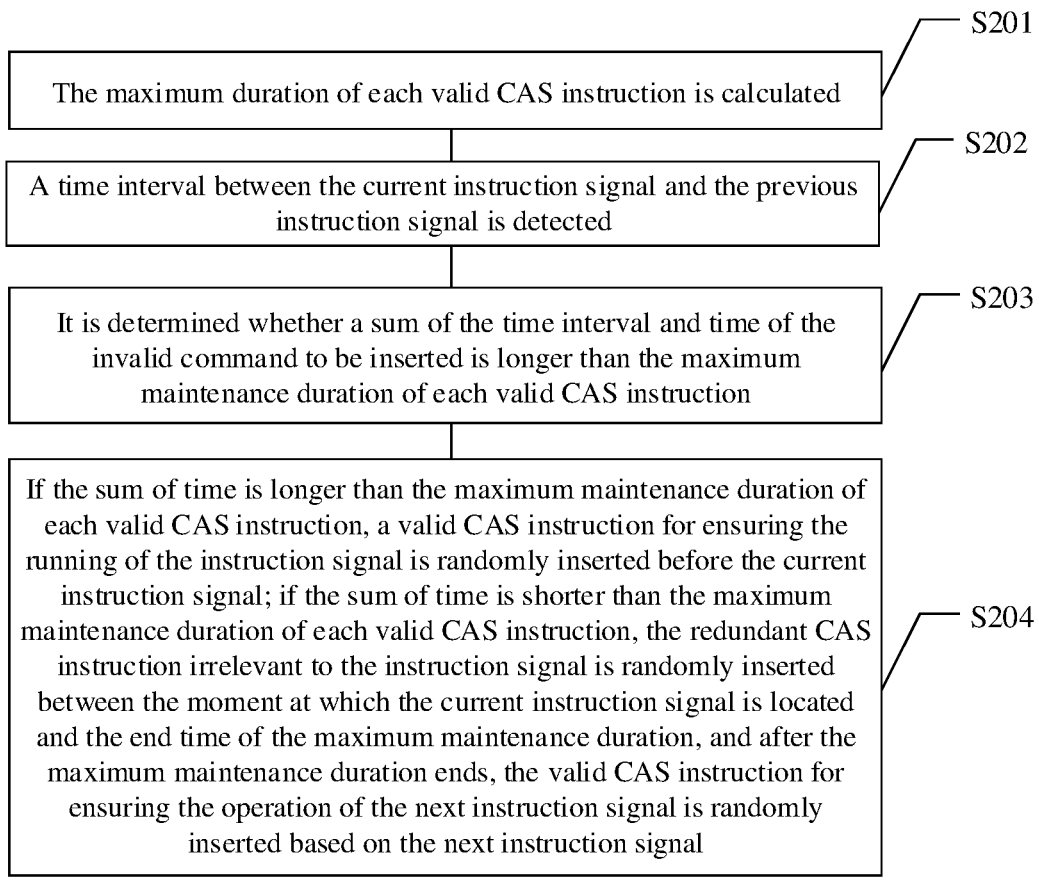
FIG. 4 is a schematic flow chart of part of step S20 in FIG. 1 according to another exemplary embodiment of the disclosure.

In another embodiment of the disclosure, as illustrated in FIG. 4, S20 may include steps S201 to S204. At step S201, the maximum duration of all valid CAS instructions is calculated. At step S202, a time interval between the current instruction signal and the previous instruction signal is detected. At step S203, it is determined whether a sum of the time interval and time of the invalid command to be inserted is longer than the maximum maintenance duration of all valid CAS instructions. At step S204, if the sum of time is longer than the maximum maintenance duration of all valid CAS instructions, a valid CAS instruction for ensuring the running of the instruction signal is randomly inserted before the current instruction signal. If the sum of time is shorter than the maximum maintenance duration of all valid CAS instruction, the redundant CAS instruction irrelevant to the instruction signal is randomly inserted between the moment at which the current instruction signal is located and the end time of the maximum maintenance duration, and after the maximum maintenance duration ends, the valid CAS instruction for ensuring the operation of the next instruction signal is randomly inserted based on the next instruction signal.

Figure 5:
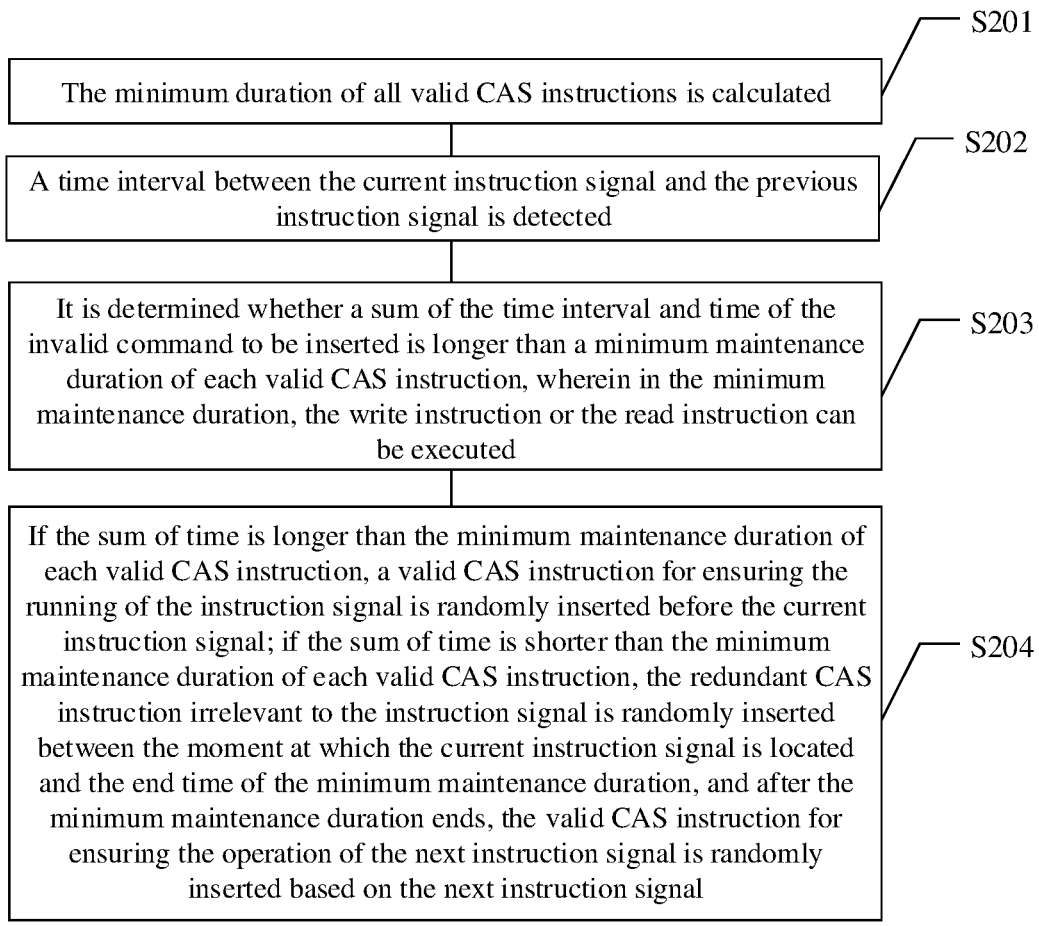
FIG. 5 is a schematic flow chart of part of step S20 in FIG. 1 according to another exemplary embodiment of the disclosure.

In an embodiment of the present disclosure, as illustrated in FIG. 5, S20 may include steps S201 to S204. At step S201, the minimum duration of all valid CAS instructions is calculated. At step S202, a time interval between the current instruction signal and the previous instruction signal is detected. At step S203, it is determined whether a sum of the time interval and time of the invalid command to be inserted is longer than a minimum maintenance duration of all valid CAS instructions, herein in the minimum maintenance duration, the write instruction or the read instruction can be executed. At step S204, if the sum of time is longer than the minimum maintenance duration of all valid CAS instructions, a valid CAS instruction for ensuring the running of the instruction signal is randomly inserted before the current instruction signal. If the sum of time is shorter than the minimum maintenance duration of all valid CAS instructions, the redundant CAS instruction irrelevant to the instruction signal is randomly inserted between the moment at which the current instruction signal is located and the end time of the minimum maintenance duration, and after the minimum maintenance duration ends, the valid CAS instruction for ensuring the operation of the next instruction signal is randomly inserted based on the next instruction signal.

Figure 6:
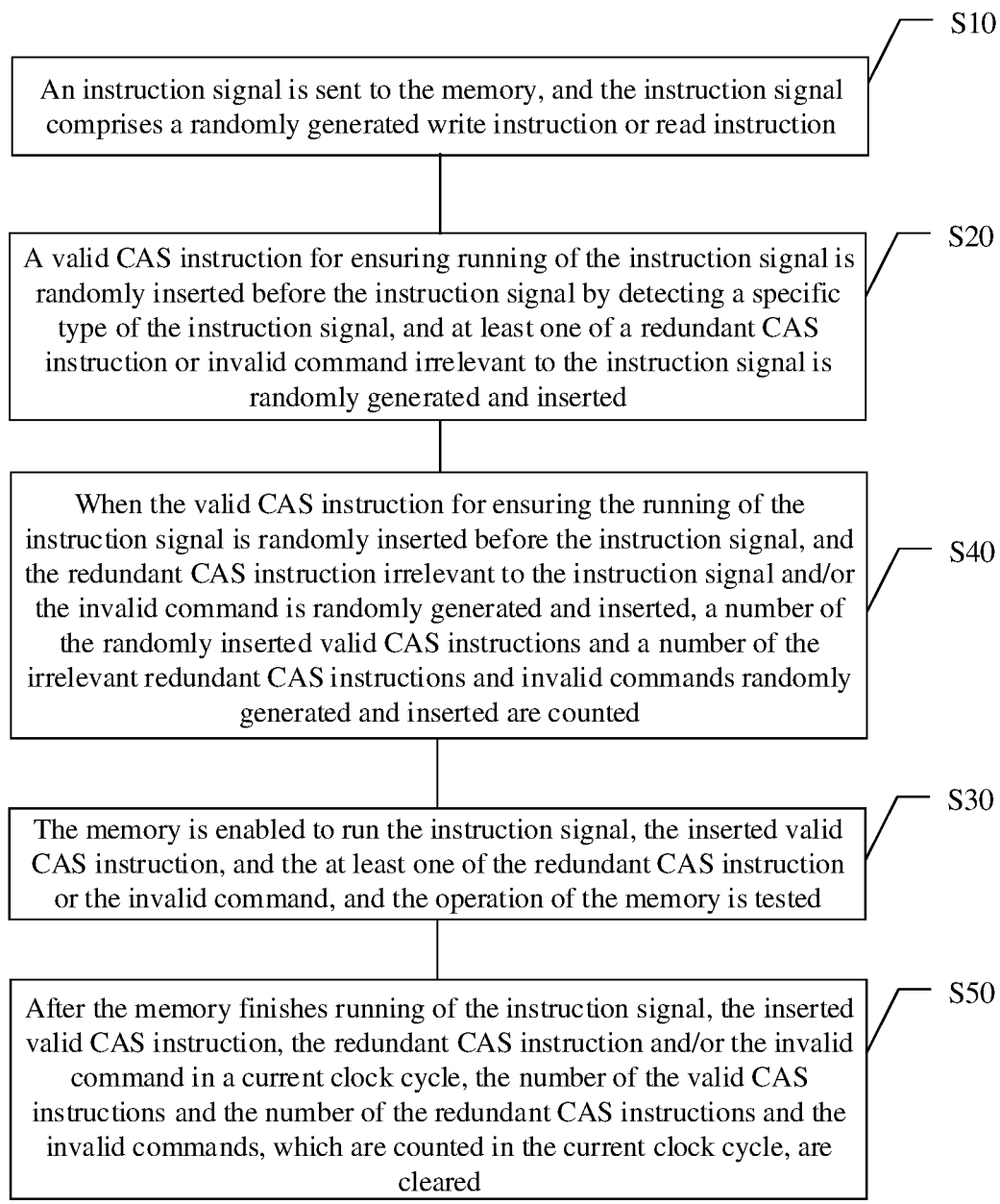
FIG. 6 is a schematic flow chart of a method for testing a memory according to another exemplary embodiment of the disclosure.

In an embodiment of the disclosure, as illustrated in FIG. 6, the memory testing method includes steps S40 to S50.

At step S40, when the valid CAS instruction for ensuring the running of the instruction signal is randomly inserted before the instruction signal, and the redundant CAS instruction irrelevant to the instruction signal and/or the invalid command is randomly generated and inserted, a number of the randomly inserted valid CAS instructions and a number of the irrelevant redundant CAS instructions and invalid commands randomly generated and inserted are counted.

At step S50, after the memory finishes running of the instruction signal, the inserted valid CAS instruction, the redundant CAS instruction and/or the invalid command in a current clock cycle, the number of the valid CAS instructions and the number of the redundant CAS instructions and the invalid commands, which are counted in the current clock cycle, are cleared.

In the present embodiment, a counter may be used to count the number of valid CAS instructions randomly inserted, and the number of irrelevant redundant CAS instructions and invalid commands randomly generated and inserted, but not limited thereto, and the number thereof may also be counted by using other elements, which are within the scope of protection of the present disclosure.

Figure 7:
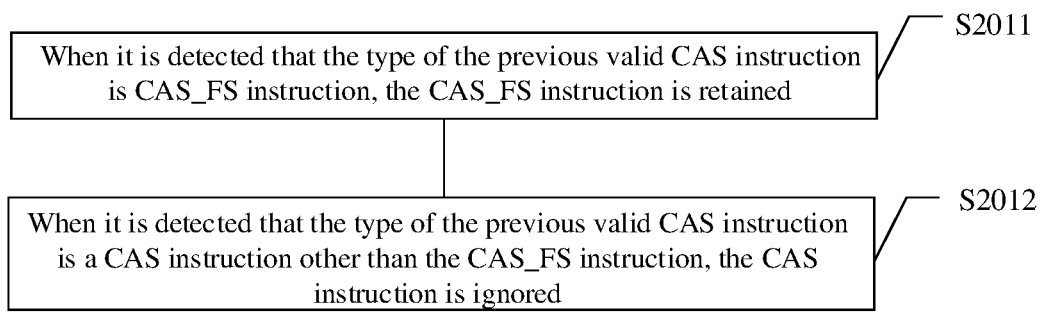
FIG. 7 is a schematic flow chart of part of step S201 in FIG. 2 according to an exemplary embodiment of the disclosure.

In an embodiment of the disclosure, as illustrated in FIG. 7, the operation of detecting the type of a previous valid CAS instruction may include steps S2011 to S2012.

At step S2011, when the detected type of the previous valid CAS instruction is CAS_FS instruction, the CAS_FS instruction is retained.

At step S2012, when the detected type of the previous valid CAS instruction is a CAS instruction other than the CAS_FS instruction, the CAS instruction is ignored.

In the present embodiment, since the CAS_FS instruction is still in the maintenance duration, it is impossible to insert other valid CAS instructions between the CAS_FS instruction and the next instruction signal adjacent to the CAS_FS instruction. Therefore, when it is detected that the type of the previous valid CAS instruction is a CAS_FS instruction, the CAS_FS instruction is retained, such that the defect that other valid CAS instructions cannot be inserted between the CAS_FS instruction and the next instruction signal adjacent thereto can be remedied.

Figure 8:
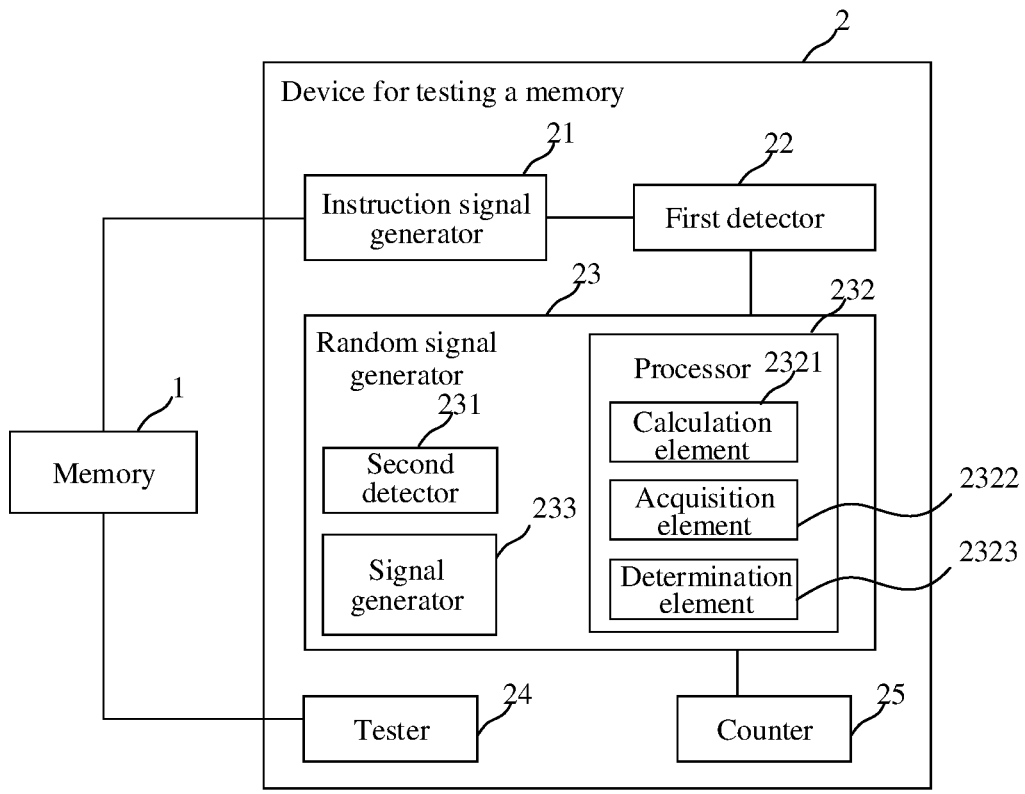
FIG. 8 is a schematic diagram of the module structure of a device for testing a memory according to an exemplary embodiment of the disclosure.

As illustrated in FIG. 8, another aspect of the present disclosure provides a memory test device 2 capable of adopting the above-described method for testing the memory 1. By using the memory test device 2, all the situations that may be encountered in the actual use of the memory can be simulated as thoroughly as possible during the test.

The memory test device 2 provided by the present disclosure may include: an instruction signal generator 21, a first detector 22, a random signal generator 23 and a tester 24.

The instruction signal generator 21 is connected with the memory 1 and configured to send an instruction signal to the memory 1. The instruction signal generator 21 may be a processor 31, a host for testing, or the like, which is not limited in the present disclosure and may be selected according to the specific testing environment, all of which are within the scope of protection of the present disclosure. The instruction signal sent by the instruction signal generator 21 includes a randomly generated write instruction or read instruction.

The first detector 22 is connected with the instruction signal generator 21, and configured to detect a specific type of the instruction signal and send the detected specific type information of the instruction signal to the random signal generator 23.

The random signal generator 23 is connected with the first detector 22 and configured to receive the specific type information of the instruction signal detected and sent by the first detector 22. The random signal generator 23 may be configured to: randomly insert a valid CAS instruction for ensuring running of the instruction signal before the instruction signal, and randomly generate and insert at least one of a redundant CAS instruction or invalid command irrelevant to the instruction signal.

The tester 24 is connected with the memory 1 and configured to test an operation of the memory 1.

The random signal generator 23 provided by the present disclosure may further include: a second detector 231, a processor 232 and a signal generator 233.

In an embodiment of the disclosure, the second detector 231 may be configured to: detect a type of a previous valid CAS instruction; and detect a time interval between a current instruction signal and the previous instruction signal.

The processor 232 may be configured to: determine whether an execution of the current instruction signal can be ensured; determine whether a sum of the time interval and time of the invalid command to be inserted is longer than a maximum maintenance duration of the previous valid CAS instruction; and responsive to that the sum of time is longer than the maintenance duration, determine whether the time interval is longer than the maintenance duration.

The signal generator 233 may be configured to: responsive to that the time interval is longer than the maintenance duration, randomly insert the valid CAS instruction for ensuring the running of the instruction signal before the current instruction signal, and randomly insert the at least one of the redundant CAS instruction or the invalid command between the inserted valid CAS instruction and the current instruction signal.

In the present embodiment, the second detector 231 may retain the CAS_FS instruction when it is detected that the type of the previous valid CAS instruction is the CAS_FS instruction. Furthermore, the second detector 231 may also ignore other CAS instructions when it is detected that the type of the previous valid CAS instruction is other CAS instructions other than the CAS_FS instruction. In this way, the first detector 22 can remedy the defect that other valid CAS instructions cannot be inserted between the CAS_FS instruction and the next instruction signal adjacent thereto.

In the present embodiment, the processor 232 may further include: a calculation element 2321, an acquisition element 2322 and a determination element 2323. The calculation element 2321 may be configured to calculate a sum of time of the time interval and the invalid command to be inserted. The acquisition element 2322 may be used to acquire the duration of the previous valid CAS instruction. The determination element 2323 may be configured to compare the sum of time with the duration of the previous valid CAS instruction to determine whether the sum of time is longer than the duration of the previous valid CAS instruction.

In another embodiment of the disclosure, the second detector 231 may be configured to: calculate the maximum maintenance duration of all valid CAS instructions; and detect a time interval between a current instruction signal and the previous instruction signal.

The processor may be configured to determine whether a sum of the time interval and time of the invalid command to be inserted is longer than the maximum maintenance duration of all valid CAS instructions.

The signal generator 233 may be configured to: if the sum of time is longer than the maximum maintenance duration, randomly insert a valid CAS instruction for ensuring the running of the instruction signal before the current instruction signal; and if the sum of time is shorter than the maximum maintenance duration, randomly insert the redundant CAS instruction irrelevant to the instruction signal between the moment at which the current instruction signal is located and the end time of the maximum maintenance duration, and after the maximum maintenance duration ends, randomly insert the valid CAS instruction for ensuring the operation of the next instruction signal based on the next instruction signal.

In another embodiment of the disclosure, the second detector 231 may be configured to: calculate the minimum maintenance duration of all valid CAS instructions; and detect a time interval between a current instruction signal and the previous instruction signal.

The processor 232 may be configured to determine whether a sum of the time interval and time of the invalid command to be inserted is longer than the minimum maintenance duration of all valid CAS instructions.

The signal generator 233 may be configured to: if the sum of time is longer than the minimum maintenance duration, randomly insert a valid CAS instruction for ensuring the running of the instruction signal before the current instruction signal; and if the sum of time is shorter than the minimum maintenance duration, randomly insert the redundant CAS instruction irrelevant to the instruction signal between the moment at which the current instruction signal is located and the end time of the minimum maintenance duration, and after the minimum maintenance duration ends, randomly insert the valid CAS instruction for ensuring the operation of the next instruction signal based on the next instruction signal.

In an embodiment of the present disclosure, the signal generator 233 in the above-described embodiments may also be configured to generate and insert the invalid command. Moreover, after the valid CAS instruction inserted in the maintenance duration of the previous valid CAS instruction and before the current instruction signal, a number of the redundant CAS instructions and/or the invalid commands inserted by the signal generator 233 is not greater than 7 in total.

In an embodiment of the disclosure, the memory test device 2 may further include a counter 25. The counter may be configured to count a number of the randomly inserted valid CAS instructions and a number of the irrelevant redundant CAS instructions and invalid commands randomly generated and inserted.

It is to be noted that the memory test device 2 described in this section can apply the above-described method for testing the memory 1. Therefore, the specific method applied in the memory test device 2 and the technical effect thereof are not described herein, and can refer to the above-mentioned specific description of the method for testing the memory 1. The type of the instruction signal, the type of the valid CAS instruction, the type of the redundant CAS instruction, etc. will not be elaborated herein, and can also refer to the above-mentioned detailed description of the method for testing the memory 1.

Another aspect of the present disclosure provides an electronic device 3. Those skilled in the art will understand that aspects of the present disclosure may be implemented as system, method or program product. Accordingly, various aspects of the disclosure may be embodied in the following form: a full hardware embodiment, a full software embodiment (including firmware, microcode, etc.), or a combination of hardware and software, which may be collectively referred to as "circuitry", "module", or "system" herein.

The electronic device 3 according to an embodiment of the present disclosure is described with reference to FIG. 9 as below. The electronic device 3 illustrated in FIG. 9 is merely an example and should not impose any limitation on the function and scope of use of the embodiment of the present disclosure.

Figure 9:
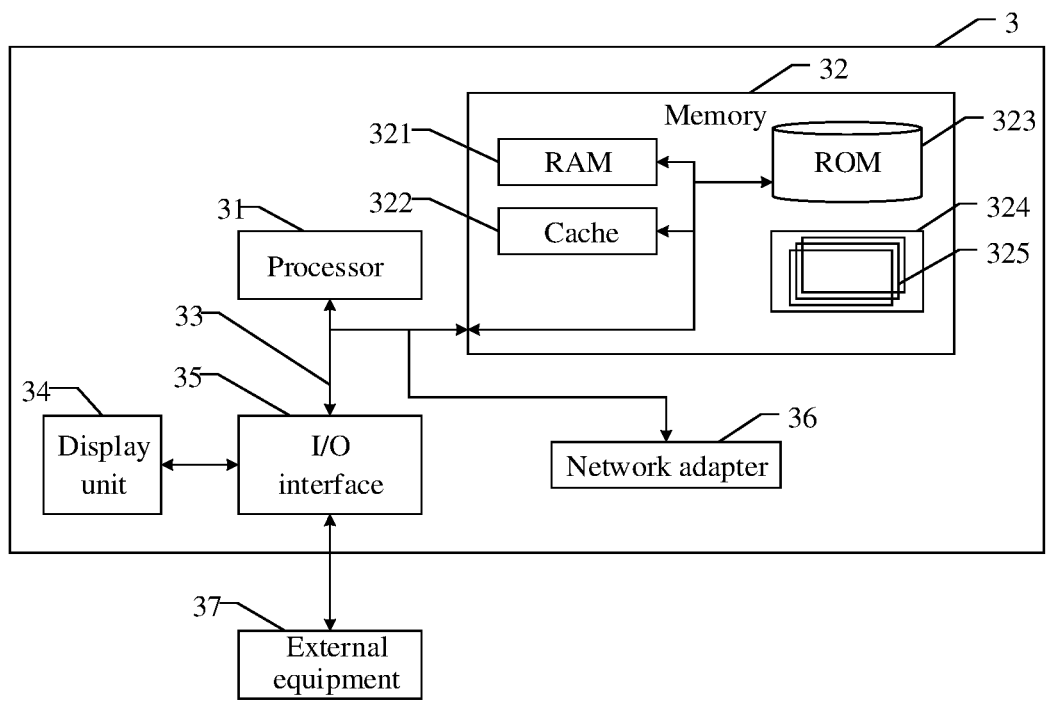
FIG. 9 a schematic diagram of the module structure of an electronic device according to an exemplary embodiment of the disclosure.

As illustrated in FIG. 9, the electronic device 3 is represented in the form of a general purpose computing device. Components of the electronic device 3 may include, but are not limited to, at least one processor 31, at least one memory 32, a bus 33 connecting different system components and a display unit 34.

Wherein, the memory 32 stores program code that can be executed by the processor 31, so that the Processor 31 performs the steps according to various exemplary embodiments of the present disclosure described in the above-mentioned "exemplary methods" section. For example, the processor 31 may be configured to perform steps S10 to S30 as illustrated in FIG. 1 or steps S10 to S50 as illustrated in FIG. 6 by executing the executable instruction.

The memory 32 may be configured to store an instruction executable by the processor 31. The memory 32 may include a readable medium in the form of a volatile memory unit, such as a Random Access Memory (RAM) unit 321 and/or a cache memory unit 322, and may further include a Read-Only Memory unit (ROM) 323.

The memory 32 may also include a program/utility 324 having a set of (at least one) program modules 325. The program includes, but not limited to, an operating system, one or more application programs, other program modules 325, and program data, each or some combination of which may include an implementation of a network environment.

Bus 33 may represent one or more of several types of bus structures, which includes a memory bus or memory controller, a peripheral bus, a graphics acceleration port, a processing unit, or a local bus using any of a plurality of bus structures.

The electronic device 3 may also communicate with one or more external equipment 37 (e.g. a keyboard, a pointing device, a Bluetooth device, etc.). The electronic device 3 may also communicate with one or more devices that enable a user to interact with the electronic device 3, and/or with any device (e.g. router, modem, etc.) that enables the electronic device 3 to communicate with one or more other computing devices. Such communication may be performed through an input/output (I/O) interface 35. Further, the electronic device 3 may also communicate with one or more networks (e.g. a Local Area Network (LAN) a Wide Area Network (WAN) and/or a public network such as the Internet) through the network adapter 36. As illustrated in the figure, the network adapter 36 communicates with other modules of the electronic device 3 through a bus 33. It is to be understood that, although not illustrated in the figure, other hardware and/or software modules (including but not limited to: microcode, device drivers, redundant processing unit, external disk drive array, Redundant Array of Independent Disk (RAID) system, tape drive, and data backup storage system, etc.) may be used in conjunction with the electronic device 3.

Through the above description of the embodiments, it will be readily understood by those skilled in the art that the exemplary embodiments described herein may be implemented by software or in combination with necessary hardware. Therefore, the technical solution according to the embodiment of the present disclosure can be embodied in the form of a software product. The software product may be stored on a non-volatile storage medium (which may be a Compact Disc Read-Only Memory (CD-ROM), a USB disk, a removable hard disk, etc.) or on a network, and includes instructions to cause a computing device (which may be a personal computer, a server, a terminal device, or a network device, etc.) to perform a method according to an embodiment of the present disclosure.

Figure 10:
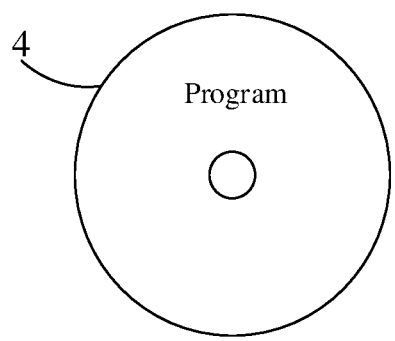
FIG. 10 is a schematic diagram of the computer-readable medium according to an exemplary embodiment of the disclosure.

In another aspect of the present disclosure, as illustrated in FIG. 10, there is also provided a computer readable storage medium on which is stored a computer program 4 capable of implementing the above method of the present specification. In some possible embodiments, aspects of the disclosure may also be implemented in the form of a computer program product including program code. The program code is used for, when the program product is run on the terminal device, causing the terminal device to perform the steps according to various exemplary embodiments of the disclosure described in the above-mentioned "exemplary methods" section.

Referring to FIG. 10, there is described a program product according to an embodiment of the present disclosure for implementing the above method for testing the memory. The program product may employ a portable CD-ROM and include program code, and may run on a terminal device, such as a personal computer. However, the program product of the present disclosure is not limited thereto, and herein the computer-readable storage medium may be any tangible medium including or storing a program.

The program may be used by or in conjunction with an instruction execution system, apparatus, or device.

The program product may employ any combination of one or more readable medium. The readable medium may be a readable signal medium or a readable storage medium. The readable storage medium may be, for example, but is not limited to, electrical, magnetic, optical, electromagnetic, infrared, or semiconductor system, apparatus or device, or any combination thereof. More specific examples (non-exhaustive list) of the readable storage medium include: an electrical connection having one or more conductors, a portable disk, a hard disk, a RAM, a ROM, an Erasable Programmable Read-Only Memory (EPROM or a flash memory), an optical fiber, a CD-ROM, a Digital Video Disk (DVD), a memory stick, a floppy disk, a mechanical coding device, an optical memory device, a magnetic memory device, and any appropriate combination thereof.

The computer-readable signal medium may include a data signal, which carries the readable program code, propagated in a baseband or as part of a carrier. Such propagated data signal may take a variety of forms, which include, but not limited to, electromagnetic signal, optical signal, or any suitable combination thereof. The readable signal medium may also be any readable medium other than the readable storage medium. The readable medium may send, propagate, or transmit a program which is used by or in conjunction with an instruction execution system, apparatus, or device.

The program code contained on the readable medium may be transmitted by using any suitable medium, which includes, but not limited to, wireless, wired, optical fiber, Radio Frequency (RF), etc. or any suitable combination thereof.

The program code for performing the operations of the present disclosure may be written in any combination of one or more programming languages, which include the object-oriented programming language (such as Java, C++, etc.), and conventional procedural programming language (such as "C" or similar programming languages). The program code may be completely executed in a user computing device, partially executed in a user computing device, executed as an independent software package, executed partially in the user computing device and partially in a remote computing device, or executed completely in the remote server or a server. In a case involving the remote computing device, the remote computing device may be connected to the user computing device via a type of network including the LAN or the WAN, or may be connected to an external computing device (such as using an Internet service provider to provide the Internet connection).

Further, the above drawings are merely schematic illustration of the processes included in the method according to the exemplary embodiments of the present disclosure and are not intended to the purpose of limitation. It is to be understood that the processes illustrated in the above drawings do not indicate or limit the temporal order of these processes. In addition, it is to be understood that these processes may be, for example, performed synchronously or asynchronously in multiple modules.

Through the above description of the embodiments, it will be readily understood by those skilled in the art that the exemplary embodiments described herein may be implemented by software or in combination with necessary hardware. Therefore, the technical solution according to the embodiment of the present disclosure can be embodied in the form of a software product. The software product may be stored on a non-volatile storage medium (which may be a Compact Disc Read-Only Memory (CD-ROM), a USB disk, a removable hard disk, etc.) or on a network, and includes instructions to cause a computing device (which may be a personal computer, a server, a touch terminal, or a network device, etc.) to perform a method according to an embodiment of the present disclosure.

Other embodiments of the present disclosure will readily occur to those skilled in the art considering the specification and practicing the disclosure herein. The present disclosure is intended to encompass any variations, uses, or modifications of the present disclosure that follow the general principles of the present disclosure and include common sense or conventional techniques in the art that are not disclosed in the present disclosure. The specification and embodiments are to be considered exemplary only and the true scope and spirit of the present disclosure are indicated in the claims.

The invention claimed is:

1. A method for testing a memory, comprising:
   sending an instruction signal to the memory, the instruction signal comprising a write instruction or a read instruction;
   randomly inserting a valid Column Address Strobe (CAS) instruction before the instruction signal by detecting a specific type of the instruction signal, the CAS instruction being used to ensure that the instruction signal is run, and randomly generating and inserting at least one of a redundant CAS instruction or invalid command irrelevant to the instruction signal;
   running the instruction signal, the inserted valid CAS instruction, and the at least one of the redundant CAS instruction or the invalid command by the memory; and
   testing the running of the instruction signal by the memory;
   wherein randomly inserting the valid CAS instruction for ensuring the running of the instruction signal before the instruction signal, and randomly generating and inserting the at least one of the redundant CAS instruction or invalid command irrelevant to the instruction signal comprises:
   detecting a type of a previous valid CAS instruction and determining whether an execution of a current instruction signal is ensured;
   responsive to that the execution of the current instruction signal is ensured, detecting a time interval between the current instruction signal and the previous valid CAS instruction;
   determining whether a sum of the time interval and a time of the invalid command to be inserted is longer than a maintenance duration of the previous valid CAS instruction, wherein in the maintenance duration, the write instruction or the read instruction is executed; and
   responsive to that the sum of time is longer than the maintenance duration, determining whether the time interval is longer than the maintenance duration, and responsive to that the time interval is longer than the maintenance duration, inserting the valid CAS instruction for ensuring the running of the instruction signal before the current instruction signal, and randomly inserting the at least one of the redundant CAS instruction or the invalid command between the inserted valid CAS instruction and the current instruction signal.

2. The method for testing the memory of claim 1, further comprising: responsive to that the time interval is equal to the maintenance duration, executing the current instruction signal in a remaining maintenance duration; or responsive to that the time interval is equal to the maintenance duration, inserting the valid CAS instruction for ensuring the running of the current instruction signal and inserting the at least one of the redundant CAS instruction or the invalid command in the maintenance duration of the inserted valid CAS instruction and then executing the current instruction signal.

3. The method for testing the memory of claim 1, further comprising: responsive to that the time interval is shorter than the maintenance duration, executing the current instruction signal in a remaining maintenance duration; or responsive to that the time interval is shorter than the maintenance duration, in the remaining maintenance duration, inserting the at least one of the redundant CAS instruction or the invalid command and then executing the current instruction signal; or responsive to that the time interval is shorter than the maintenance duration, inserting the valid CAS instruction for ensuring the running of the current instruction signal, and in the maintenance duration of the inserted valid CAS instruction, inserting the at least one of the redundant CAS instruction or the invalid command and then executing the current instruction signal.

4. The method for testing the memory of claim 1, further comprising: responsive to that the sum of time equals to the maintenance duration, inserting the invalid command, and executing the current instruction signal in a remaining maintenance duration; or responsive to that the sum of time equals to the maintenance duration, inserting the invalid command, and then inserting the valid CAS instruction for ensuring the running of the current instruction signal, and in the maintenance duration of the inserted valid CAS instruction, inserting the redundant CAS instruction and then executing the current instruction signal.

5. The method for testing the memory of claim 1, further comprising: responsive to that the sum of time is shorter than the maintenance duration, inserting the invalid command, and in a remaining maintenance duration, inserting the redundant CAS instruction and then executing the current instruction signal; or responsive to that the sum of time is shorter than the maintenance duration, inserting the invalid command and then inserting the valid CAS instruction for ensuring the running of the current instruction signal, and in the maintenance duration of the inserted valid CAS instruction, inserting the redundant CAS instruction and executing the current instruction signal.

6. The method for testing the memory of claim 1, wherein the maintenance duration is a maximum maintenance duration of the previous valid CAS instruction, or a minimum maintenance duration of the previous valid CAS instruction, or an average maintenance duration of all valid CAS instructions.

7. The method for testing the memory of claim 2, wherein a total number of redundant CAS instructions and/or invalid commands that are inserted after the valid CAS instruction inserted in the maintenance duration of the previous valid CAS instruction and before the current instruction signal is not greater than 7.

8. The method for testing the memory of claim 1, wherein the method further comprises:
   when the valid CAS instruction for ensuring the running of the instruction signal is randomly inserted before the instruction signal and at least one of the redundant CAS instruction or invalid command irrelevant to the instruction signal is randomly generated and inserted, counting a number of the randomly inserted valid CAS instructions and a number of the redundant CAS instructions and invalid commands randomly generated and inserted.

9. The method for testing the memory of claim 4, wherein detecting the type of the previous valid CAS instruction comprises:
   when it is detected that the type of the previous valid CAS instruction is CAS_FS instruction, retaining the CAS_FS instruction; and
   when it is detected that the type of the previous valid CAS instruction is a CAS instruction other than the CAS_FS instruction, ignoring the CAS instruction.

10. The method for testing the memory of claim 1, wherein the number of the redundant CAS instructions randomly generated and inserted is greater than 1, and the redundant CAS instructions are of multiple types.

11. The method for testing the memory of claim 1, wherein the redundant CAS instruction signal comprises at least one of: a CAS_WRX instruction, a CAS_WRSB instruction or a CAS_DC instruction; and the CAS_WRX instruction is used for randomly writing data, the CAS_WRSB instruction is used for repeatedly writing high-byte data, and the CAS_DC instruction is used for copying data of a first burst and storing the data of the first burst.

12. The method for testing the memory of claim 1, wherein,
the write instruction comprises a memory write instruction and a register write instruction; and
the read instruction comprises a memory read instruction and a register read instruction.

13. A device for testing a memory, comprising:
an instruction signal generator, connected with the memory and configured to send an instruction signal to the memory;
a first detector, connected with the instruction signal generator and configured to detect a specific type of the instruction signal;
a random signal generator, connected with the first detector and configured to: randomly insert a valid Column Address Strobe (CAS) instruction before the instruction signal, and randomly generate and insert at least one of a redundant CAS instruction or invalid command irrelevant to the instruction signal, the CAS instruction being used to ensure that the instruction signal is run; and
a tester, connected with the memory and configured to test an operation of the memory;
wherein the instruction signal comprises a write instruction or a read instruction;
wherein the random signal generator comprises:
a second detector, configured to: detect a type of a previous valid CAS instruction; and detect a time interval between a current instruction signal and the previous valid CAS instruction;
a processor, configured to: determine whether an execution of the current instruction signal is ensured by the previous valid CAS instruction; determine whether a sum of the time interval and a time of the invalid command to be inserted is longer than a maintenance duration of the previous valid CAS instruction; and responsive to that the sum of time is longer than the maintenance duration, determine whether the time interval is longer than the maintenance duration; and
a signal generator, configured to: responsive to that the time interval is longer than the maintenance duration, randomly insert the valid CAS instruction for ensuring the running of the instruction signal before the current instruction signal, and randomly insert the at least one of the redundant CAS instruction or the invalid command between the inserted valid CAS instruction and the current instruction signal.

14. The device for testing the memory of claim 13, wherein the device further comprises:
a counter, configured to count a number of the randomly inserted valid CAS instructions and a number of the redundant CAS instructions and invalid commands randomly generated and inserted.

15. A computer-readable storage medium having stored thereon a computer program that when executed by a processor, implements a method for testing a memory, the method comprising:
sending an instruction signal to the memory, the instruction signal comprising a write instruction or a read instruction;
randomly inserting a valid Column Address Strobe (CAS) instruction before the instruction signal by detecting a specific type of the instruction signal, the CAS instruction being used to ensure that the instruction signal is run, and randomly generating and inserting at least one of a redundant CAS instruction or invalid command irrelevant to the instruction signal;
running the instruction signal, the inserted valid CAS instruction, and the at least one of the redundant CAS instruction or the invalid command by the memory; and
testing the running of the instruction signal by the memory;
wherein randomly inserting the valid CAS instruction for ensuring the running of the instruction signal before the instruction signal, and randomly generating and inserting the at least one of the redundant CAS instruction or invalid command irrelevant to the instruction signal comprises:
detecting a type of a previous valid CAS instruction and determining whether an execution of a current instruction signal is ensured;
responsive to that the execution of the current instruction signal is ensured, detecting a time interval between the current instruction signal and the previous valid CAS instruction;
determining whether a sum of the time interval and a time of the invalid command to be inserted is longer than a maintenance duration of the previous valid CAS instruction, wherein in the maintenance duration, the write instruction or the read instruction is executed; and
responsive to that the sum of time is longer than the maintenance duration, determining whether the time interval is longer than the maintenance duration, and responsive to that the time interval is longer than the maintenance duration, inserting the valid CAS instruction to ensure that the current instruction signal is run before the current instruction signal, and randomly inserting the at least one of the redundant CAS instruction or the invalid command between the inserted valid CAS instruction and the current instruction signal.

16. The computer-readable storage medium of claim 15, further comprising: responsive to that the time interval is equal to the maintenance duration, executing the current instruction signal in a remaining maintenance duration; or responsive to that the time interval is equal to the maintenance duration, inserting the valid CAS instruction to ensure that the current instruction signal is run and inserting the at least one of the redundant CAS instruction or the invalid command in the maintenance duration of the inserted valid CAS instruction and then executing the current instruction signal.

17. The computer-readable storage medium of claim 15, further comprising: responsive to that the time interval is shorter than the maintenance duration, executing the current instruction signal in a remaining maintenance duration; or responsive to that the time interval is shorter than the maintenance duration, in the remaining maintenance duration, inserting the at least one of the redundant CAS instruction or the invalid command and then executing the current instruction signal; or responsive to that the time interval is shorter than the maintenance duration, inserting the valid CAS instruction to ensure that the current instruction signal is run, and in the maintenance duration of the inserted valid CAS instruction, inserting the at least one of the redundant CAS instruction or the invalid command and then executing the current instruction signal.

* * * * *